United States Patent [19]

Brown et al.

[11] Patent Number: 5,013,578
[45] Date of Patent: May 7, 1991

[54] APPARATUS FOR COATING A SURFACE WITH A METAL UTILIZING A PLASMA SOURCE

[75] Inventors: Ian G. Brown, Berkeley; Robert A. MacGill, Richmond; James E. Galvin, Emeryville, all of Calif.

[73] Assignee: University of California, Berkeley, Calif.

[21] Appl. No.: 448,379

[22] Filed: Dec. 11, 1989

[51] Int. Cl.$^5$ .............................................. C23C 16/00
[52] U.S. Cl. ........................................ 427/37; 427/38; 427/39; 118/723; 118/50.1
[58] Field of Search ......................... 427/37, 38, 39; 118/723, 50.1

[56] References Cited

U.S. PATENT DOCUMENTS 4,714,860 12/1987 Brown et al. ..................... 250/425
4,764,394 8/1988 Conrad ............................. 427/38
4,785,220 11/1959 Brown ......................... 315/111.81

Primary Examiner—Richard Bueker
Attorney, Agent, or Firm—Bielen, Peterson & Lampe

[57] ABSTRACT

An apparatus and method for coating or layering a surface with a metal utilizing a metal vapor vacuum arc plasma source. The apparatus includes a trigger mechanism for actuating the metal vacuum vapor arc plasma source in a pulsed mode at a predetermined rate. The surface or substrate to be coated or layered is supported in position with the plasma source in a vacuum chamber. The surface is electrically biased for a selected period of time during the pulsed mode of operation of the plasma source. Both the pulsing of the metal vapor vacuum arc plasma source and the electrical biasing of the surface are synchronized for selected periods of time.

11 Claims, 5 Drawing Sheets

APPARATUS FOR COATING A SURFACE WITH A METAL UTILIZING A PLASMA SOURCE

STATEMENTS AS TO RIGHTS OF INVENTION MADE UNDER FEDERALLY SPONSORED RESEARCH AND DEVELOPEMENT

The United States government has rights in this invention pursuant to contract No. DE-AC03-76SF00098 awarded by the U.S. Department of Energy.

BACKGROUND OF THE INVENTION

The present invention relates to a novel apparatus for coating a surface using a plasma source. Coating surfaces of objects are known to improve the characteristics of the same in various ways. For example prevention of corrosion of the object is improved by coating the surface with a corrosion resistant material. In addition, hardness and strength of materials may be increased, in this regard.

It is known that utilizing plasmas to provide coatings are particularly useful in achieving surface modification, especially when ions are extracted from the plasma beam and implanted beneath the surface of the bombarded body. For example, U.S. Pat. Nos. 4,714,860 and 4,785,220 issued to Brown et al, represented a great advance in the field of ion beam generation by using a metal vapor vacuum arc plasma source. In addition, U.S. Pat. No. 4,764,394 issued to Conrad describes gaseous plasmas which are implanted with the aid of a negative potential pulse applied to the target electrode.

Unfortunately simple layering with an ion source has not been as successful, since the atoms emanating from the ion source tend to peel or abrade from the surface quite easily. Such bad adhesion of the coated layers is typical of the physical vapor deposition techniques used in the prior art, also. In this regard, reference is made to co-pending patent application Ser. No. 415,616 which describes a method and device for implanting or layering the surface of a body by adjusting the energy of the metal vapor vacuum plasma source.

An apparatus and method for producing a superior coating on a surface utilizing a plasma source would be a great advance in the field of ion surface modification.

SUMMARY OF THE INVENTION

In accordance with the present invention a novel and useful apparatus and method for providing a tenacious coating on a surface in herein provided.

The apparatus of the present invention employs means for actuating the metal vapor vacuum arc (MEVVA) plasma source in a pulsed mode at a predetermined rate. Such actuating means includes a pulse generator which produces an output signal of a certain pulse width. In addition, a pulse line or arc supply having a variable power source is capable of adjusting the intensity or amplitude of the pulse signal traveling to the MEVVA plasma source, and, thus the quantity of plasma produced. The result of such controlling elements of the MEVVA plasma source produces a beam or stream of the metallic plasma possessing a predetermined mass and energy.

The surface to be coated is supported at a certain distance from the MEVVA plasma source to receive ions therefrom. At least a portion of the source and the surface to be coated or layered is positioned in a vacuum chamber.

The surface to be layered or coated is electrically biased for a selected period of time during the pulsed mode operation of the means for actuating the MEVVA plasma source. Such electrical biasing of the surface is synchronized or coordinated with the pulse mode operation of the MEVVA plasma source. In other words, the pulse width of the MEVVA plasma source may be in phase or coincide at least partially with the biasing of the surface. Such phasing may be purposefully altered to achieve large number of surface modification results. The means synchronizing the activities of the actuator of the MEVVA plasma source and the electrical biasing of the surface may take the form of a pulse delay unit electrically linked to the plasma source and to the surface being layered. In addition, the prior described alteration of the intensity or amplitude of the source pulse width actuating signal or the surface biasing signal pulse width may simply and easily achieve ion beam stitching, ion beam assisted deposition, production of metastable alloys, or other surface modification results, heretofore achieved with great difficulty.

In this regard, the source of the MEVVA plasma may consist of a plurality of distinct MEVVA plasma generators or plasma guns disposed, at least partially, in the vacuum chamber. It should be noted, that each of the plurality of plasma guns may produce a different metallic plasma. Also, the operation of multiple plasma guns may occur simultaneously, alternately, or with some overlap.

It may be apparent that a novel and useful apparatus and method for coating or layering a surface with a metal from a MEVVA plasma source has been described.

It is therefor an object of the present invention to provide an apparatus and method for coating a surface with a metal which employs a MEVVA plasma source which is relatively small and uncomplicated in its operation.

Another object of the present invention is to provide and apparatus method for coating a surface with a metal layer which is tough and not easily peeled or removed from the surface after such layering process.

Yet another object of the present invention is to provide an apparatus and method for coating surface with a metal utilizing a MEVVA plasma source which is capable of achieving ion beam mixing, ion beam assisted deposition, ion stitching, recoil ion implantation, and other ion beam coating techniques simply and easily.

A further object of the present invention is to provide an apparatus and method for coating a surface with a metal utilizing a MEVVA plasma source which operates in a pulsed mode such that variations in the pulse width, amplitude, and duty cycle, will achieve a variety of metal surface modification results.

A further object of the present invention is to provide an apparatus and method for coating surface with a metal consisting of a metastable phase of a metallic alloy.

Yet another object of the present invention is to provide an apparatus and method for coating a surface with a metal utilizing a plasma source and an elctrically biased substrate which utilizes the distribution of charge states of the metal being the positive.

The invention possesses other objects and advantages especially as concerns particular characteristics and features thereof which will become apparent as the specification continues.

Figure 1:
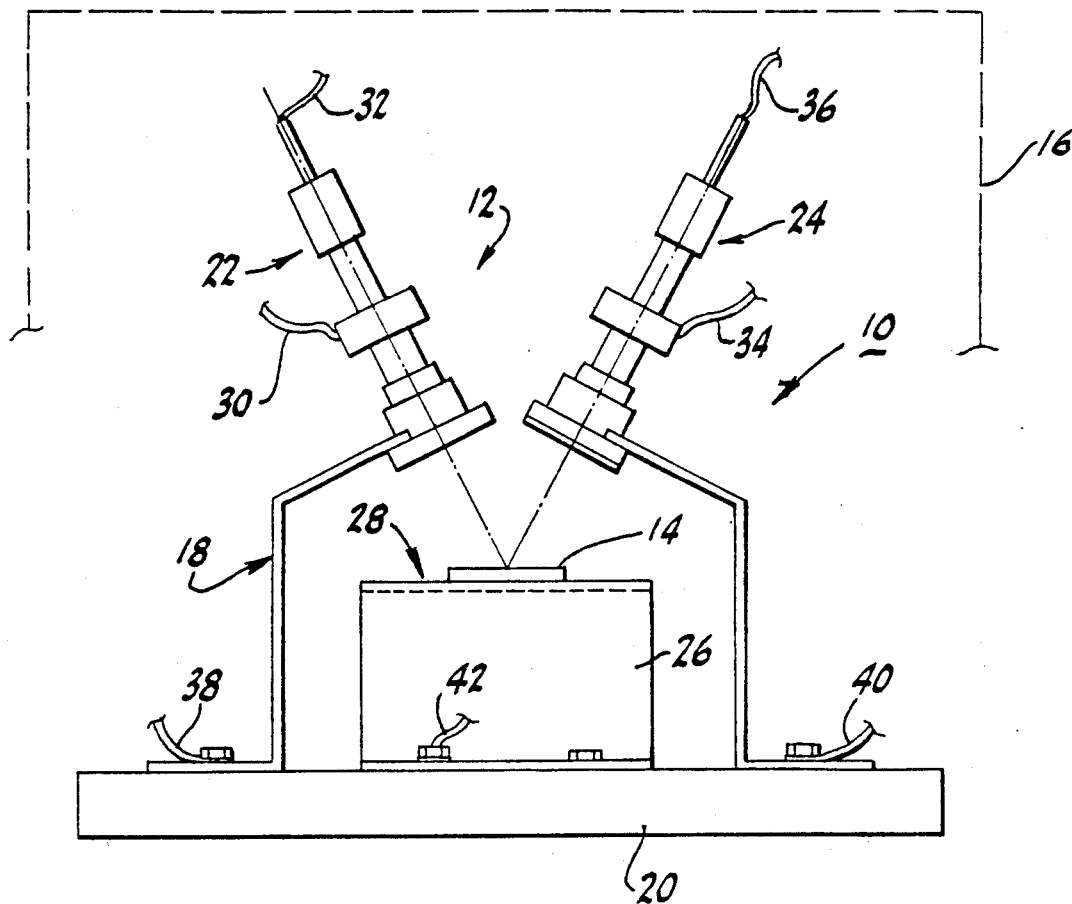
FIG. 1 is a side elevational view of a vacuum chamber depicting the apparatus of the present invention within a vacuum chamber shown schematically.

For a better understanding of the invention reference is made to the following detailed description of the preferred embodiments which should be referenced to the hereinbefore described drawings.

DESCRIPTION OF THE PREFERRED EMBODIMENTS

Various aspects of the present invention will evolve from the following detailed description of the preferred embodiments which should be viewed with the prior described drawings.

The invention as a whole is shown in the drawings by reference character 10. The apparatus 10 is intended to utilize a metal vapor vacuum arc (MEVVA) plasma source 12 for layering or coating the surface or substrate 14. Apparatus 10 is depicted, schematically, as being within a vacuum chamber 16, typically held to a vacuum of $10 \times 10^{-6}$ Torr. Conductive frame 18 is bolted to base 20 within vacuum chamber 16 and holds plasma guns 22 and 24, which constitute MEVVA plasma source 12. Conductive stand 26 is also bolted or otherwise affixed to base 20 and serves as means 28 for supporting substrate 14 within vacuum chamber 16. Plasma guns 22 and 24 are fixed a predetermined distance from substrate 14 to maximize the ion layering taking place in the present invention, which will be described in greater detail as the specification continues. Conduits 30 and 32 connected to plasma gun 22, conduits 34 and 36 connected to plasma gun 24, and conduits 38 and 40 connected to conductive frame 18 are necessary to the operation of MEVVA plasma source 12, which will be discussed hereinafter. Conduit 42 permits the biasing of substrate 14 through conductive stand 26.

Figure 2:
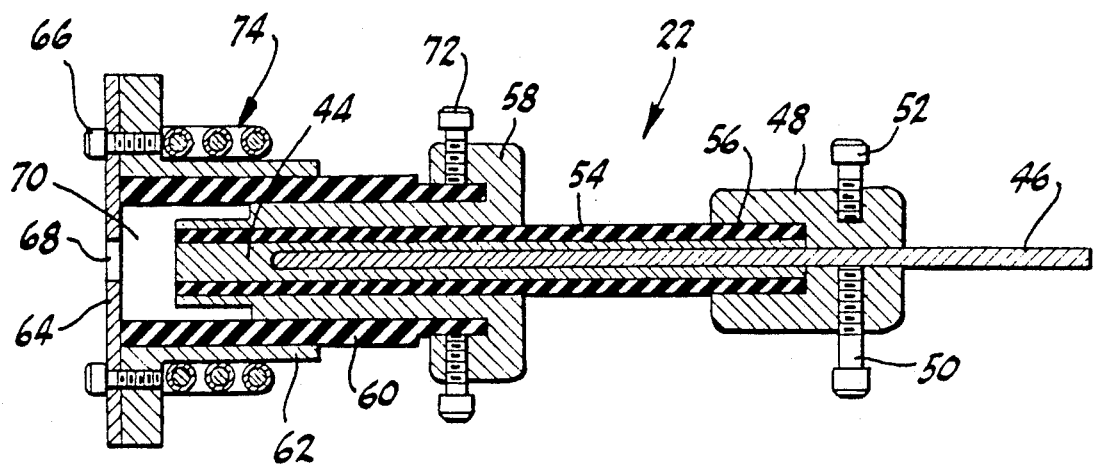
FIG. 2 is a sectional view of a metal vapor vacuum arc plasma source generator employed in FIG. 1.

With reference to FIG. 2, plasma gun 22 is illustrated and is essentially identical to plasma gun 24 shown in FIG. 1. It should be noted that plasma gun 22 is essentially identical to the plasma generator shown in co-pending patent application Ser. No. 415,616. Plasma gun 22 includes a cathode 44 composed of the metallic material which will be ionized and transported to substrate 14. Cathode 44 terminates in a conductive rod 46. Connector block 48 is held to conductive rod 46 by set screw 50. Terminal screw 52 serves as the terminus for the negative electrical biasing of cathode 14 through conduit 32. Insulator tube 54, which may be constructed of alumina or similar material, slips over cathode 44. Cathode 44 and rod 46 fastened thereto, are slidably positioned relative to insulator tube 54 to permit single replacement of cathode 44. Insulator tube 54 also is held in place by aperture 56 within connector block 48. Trigger electrode 58 encircles insulator tube 54. Insulative bushing 60 and conductive support collar 62 surround trigger electrode 58. Anode 64 is spaced from cathode 44, being affixed to conductive support collar 62 by plurality of set screws 66. Orifice 68 permits the effluence of plasma from cavity 70. Terminal 72 serves as the electrical terminal for trigger electrode 58 through conduit 30. Magnetic means 74, in the form of several turns of insulated metallic wire provide a magnetic field to the plasma generation region within cavity 70.

Figure 3:
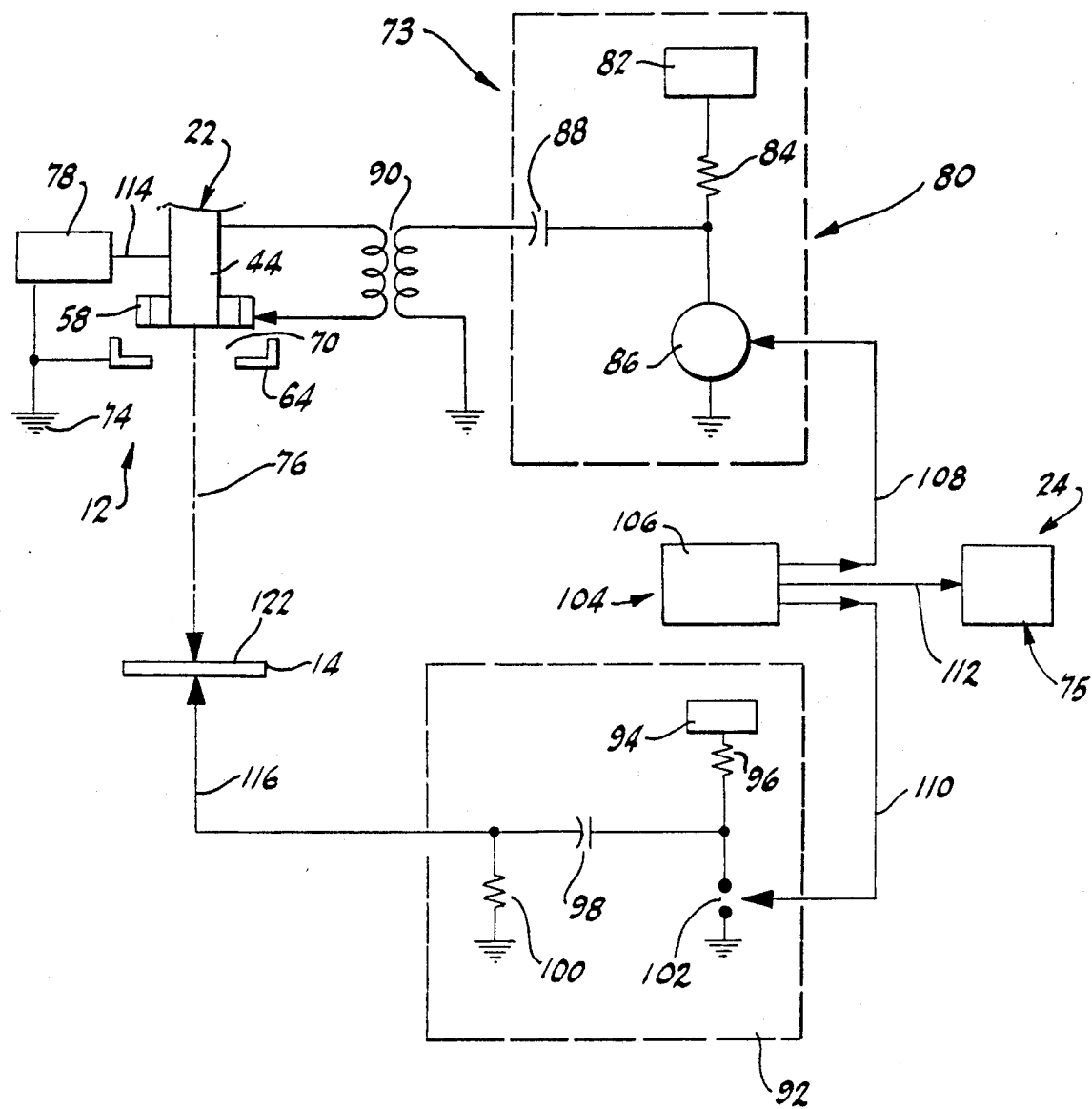
FIG. 3 is a schematic view emphasizing the electrical components of the present invention.

Referring now to FIG. 3, exemplar plasma gun 22 is depicted schematically including cathode 44, trigger electrode 58, and anode 64 which is connected to ground 74. Plasma stream 76 is illustrated as passing from cavity 70 onto substrate 14 Means 73 for actuating plasma gun 22 in a pulse mode is also depicted. Means 73 includes pulse line or adjustable arc power supply 78 which feeds cathode 44. High voltage pulse generator 80 possesses a high voltage power supply 82, resistor 84, electron tube 86, and capacitor 88. High voltage pulse generator 80 links to pulse transformer 90, which in turn actuates trigger electrode 58. Thus, a pulsed metal vapor vacuum arc plasma is generated within chamber 70 by these components.

FIG. 3 also illustrates the negative biasing of substrate 14 by employement of means 92 for biasing substrate 14 in the form of bias pulse generator 92, which includes adjustable high voltage power supply 94, resistor 96, capacitor 98, resistor 100, and spark generator 102. It should be apparent that high voltage pulse generator 92 is a variable voltage source.

Means 104 is also provided in the present invention for synchronizing or coordinating the activities of means 73 for actuating MEVVA plasma source 12 and means 92 for biasing substrate 14. Such synchronizing means 104 includes pulse delay unit 106 which times the sending of the signals 108 and 110 to electron tube 86 and spark generator 102, respectively. A third signal 112 would exit pulse delay unit 106 to fire plasma gun 24 and the means 75 for actuating the plasma gun 24 (shown schematically on FIG. 3) similar to means 73. Signals 108 and 110 may be produced at the same time, alternately, or partially in phase with one another.

In order to describe the invention more completely the following example is given without intending to limit the invention to the specific example set forth herein.

EXAMPLE I

A moderate dose of yttrium metal ions was energetically implanted into a silicon substrate. The MEVVA plasma source, shown in FIG. 1 by plasma gun 22, possessed an yttrium cathode 44. Substrate 14 was a small piece of silicon wafer located approximately four centimeters from the anode 64 of plasma gun 22. The plasma gun was pulsed, the pulses being approximately five microseconds in length. The silicon wafer was pulsed negatively to a voltage of 14 KV by causing the capacitor 98 to discharge through triggered spark gap 102 of FIG. 3. The phasing of the bias pulse on the silicon wafer and the plasma gun pulse was such that the silicon wafer was pulse biased for a short time during the plasma pulse. The plasma gun and the silicon substrate were pulsed several thousand times. The silicon wafer was then removed and analyzed by Rutherford backscattering spectrometry (RBS). It was found that a dose of $4.7 \times 10^{15}$ atoms/cm$^2$ of yttrium were implanted into the silicon with a peak in the depth profile of the buried yttrium at 90 Angstroms below the silicon wafer surface. Such indication revealed that yttrium in mulitple charged states, was energetically implanted into the silicon wafer by the plasma gun.

The following is a table of components typically used in the circuitry shown in FIG. 3.

| ITEM | MODEL # | SOURCE |
| --- | --- | --- |
| Arc Power Supply 78 | "Pulse & Digital Cir." chapt. 10 pg. 291-304 | Millman & Taub McGraw Hill 1956 |
| Power Supply 82 | HV-1584R | Power Designs Co. Palo Alto, Ca. |
| Resistor 84 | 1 MOHM | Ohmite Co. Skokie, Il. |
| Electron Tube 86 | 5C22 Thyratron | I.T.T. Easton, PA |
| Capacitor 88 | 0.1 μf 15KV | General Electric Schnenectady, NY |
| Pulse transformer 90 | TR136B | E.G. & G, Boston Mass. |
| Bias Power Supply 94 | 10KV | Power Designs Co. Palo Alto, Ca. |
| Resistor 96 | 500 Kohms | Ohmite Co. Skokie, Il. |
| Capacitor 98 | .03 μf | General Electric Schnenectady, NY |
| Resisitor 100 | 500 ohms | Ohmite. Co. Skokie, Il. |
| Spark Generator 102 | "Ref. Data for Radio Engineers" 5th edition. ITT publishers, 1974, pp 16-28 | I.T.T. Easton, PA. |
| Pulse Delay Unit 106 | Model 801 | Waveteck, Inc. San Diego, Ca. |

Figure 4:
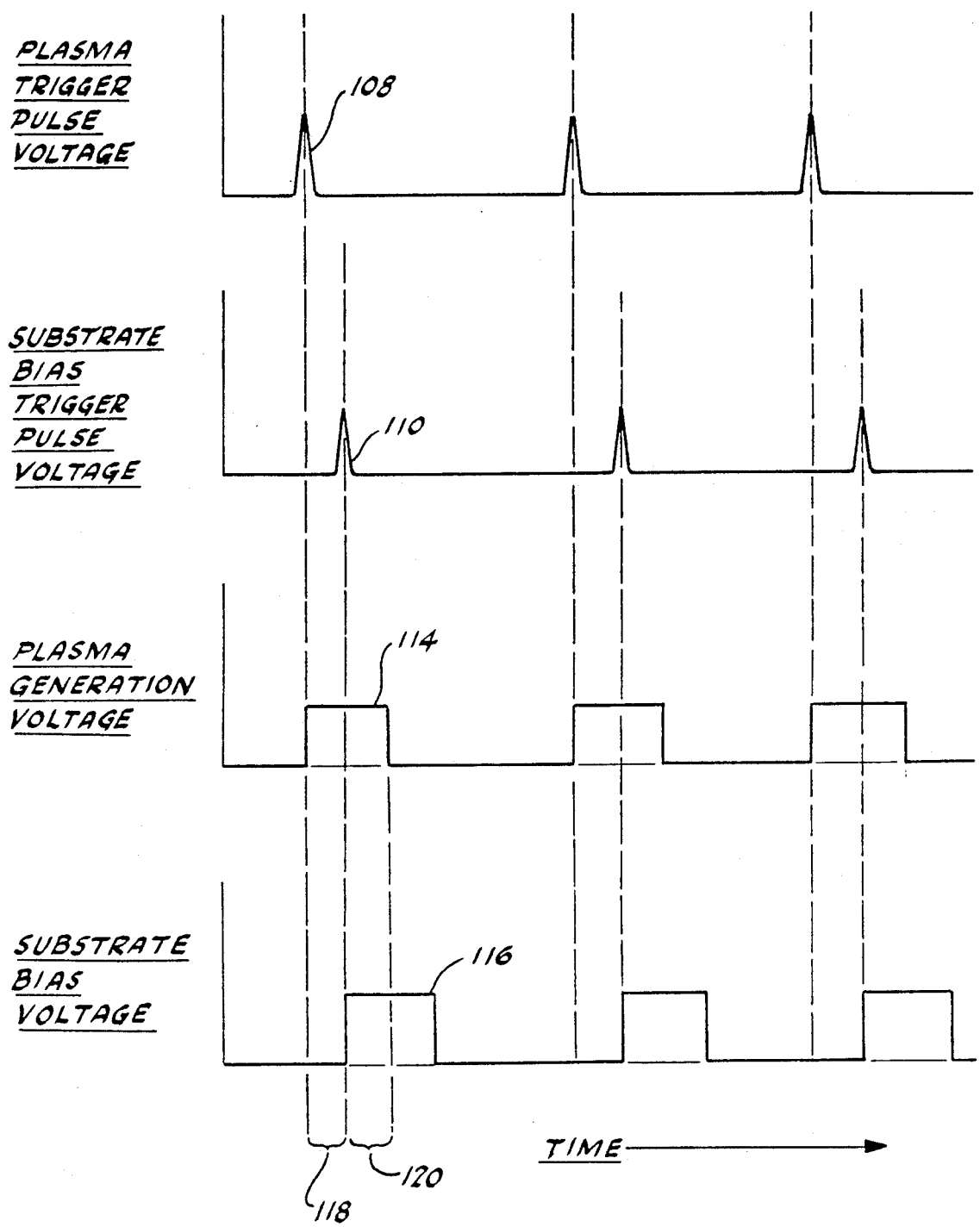
FIG. 4 is a graph depicting the synchronization of the voltages associated with the plasma source and substrate being layered.
Figure 4A:
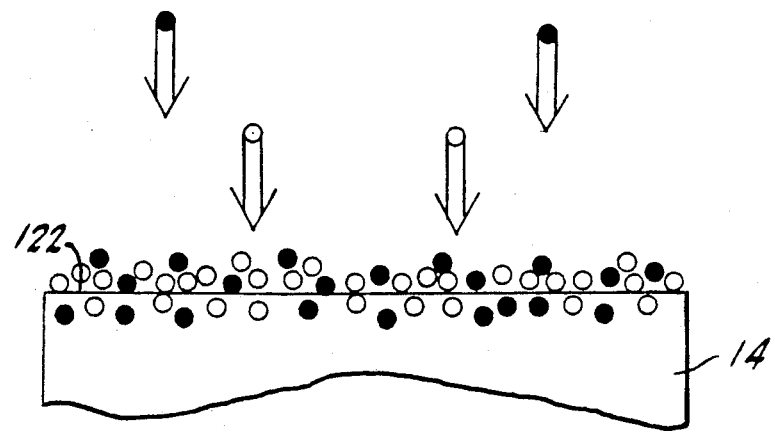
FIG. 4a is a schematic view depicting ions layering, implanting and recoiling as a result of the wave forms of FIG. 4.

In operation, the user positions plasma guns 22 and, optionally, plasma gun 24 within vacuum chamber 16 a certain distance from substrate 14 as depicted in FIG. 1. MEVVA plasma source 12 via plasma gun 22 is then activated through means 73, FIG. 3, in a synchronizied or coordinated manner relative to the biasing of substrate 14 through means 92. Such synchronizing is accomplished by pulse delay unit 106 which delivers pulse voltage signals to electron tube 86 of means 73 and spark generator 102 of means 92. A typical wave form is depicted in FIG. 4 in which pulse signals 108 and 110 are shown to occur with a slight timing offset. However, the square wave signal 114 operating exemplar plasma gun 22 and the bias voltage pulse 116 to substrate 14 overlap the time domain. In other words, the time period 118 generates plasma ions which pass to substrate 14. Further, the time period 120 represents the generation of a plasma by gun 22 coupled with the biasing of substrate 14. FIG. 4a represents ions that have been generated during both time periods 118 and 120. Ions generated during time period 118 (open circles) initially coat surface 122 of substrate 14. Ions generated during time period 120 (shaded circles) possess a higher degree of energy and tend to implant within substrate 14, as well as to implant the ions generated during time period 118 through a recoil implantation process. In addition, a portion of the ions generated during time period 120 will form a layer on surface 122. It should be noted that the recoil implantation taking place provides a coating which firmly adheres to substrate 14.

Figure 5:
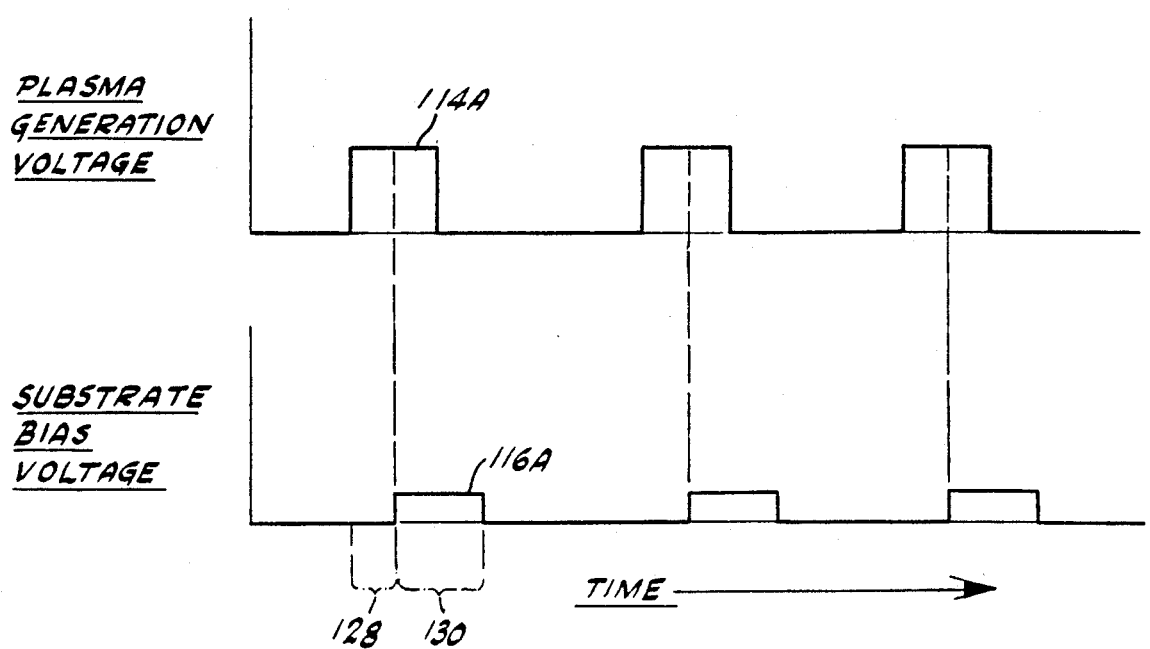
FIG. 5 is a graph depicting amplitude alteration of synchronized plasma and substrate voltages in the layering process of the present invention.
Figure 5A:
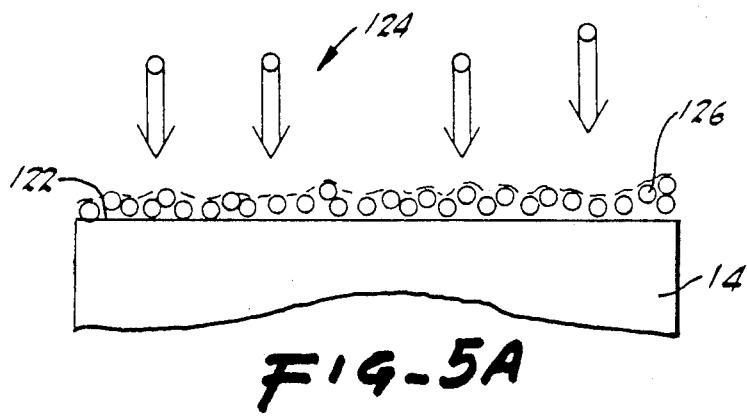
FIGS. 5a and 5b are schematic views representing ion layering and recoil implantation resulting from the synchronization voltages depicted in FIG. 5.
Figure 5B:
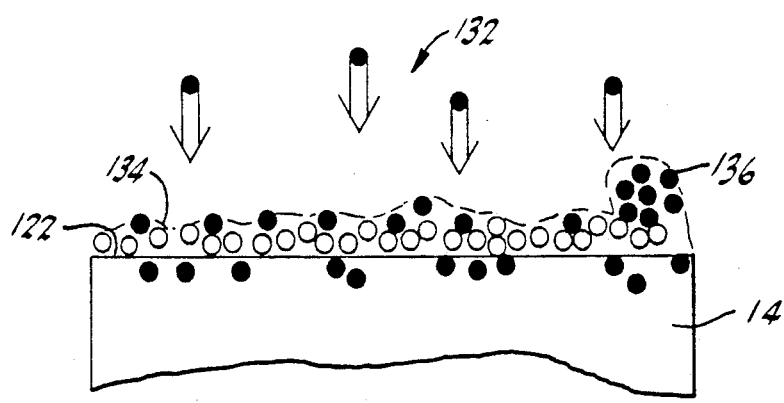

FIGS. 5, 5a and 5b further represent the operation of the apparatus and method of the present invention where the bias voltage pulse 116a is of lower amplitude. Such adjustment may come from varying the high voltage bias power supply 94 within bias pulse generator 92. FIG. 5a shows the inital coating of surface 122 by ions 124 to form layer 126 during time period 128. The subsequent biasing of substrate 114 during time period 130 results in ions 132 which tend to implant or ion stitch such layer 126. Since the substrate bias voltage 116a is lower than voltage 116 shown in FIG. 4, recoil implantation does not occur. However, the ion stitching shown in FIG. 5b also provides good adherence of layer 134 to substrate 14. Ions 132 tend to form a higher layer portion 136 during the later part of time period 130 of FIG. 5. 20, It should be observed that the ion intermixing shown within layer 134 of FIG. 5b may constitute the formation of metastable alloys or may constitute simple atomic mixing.

Figure 6:
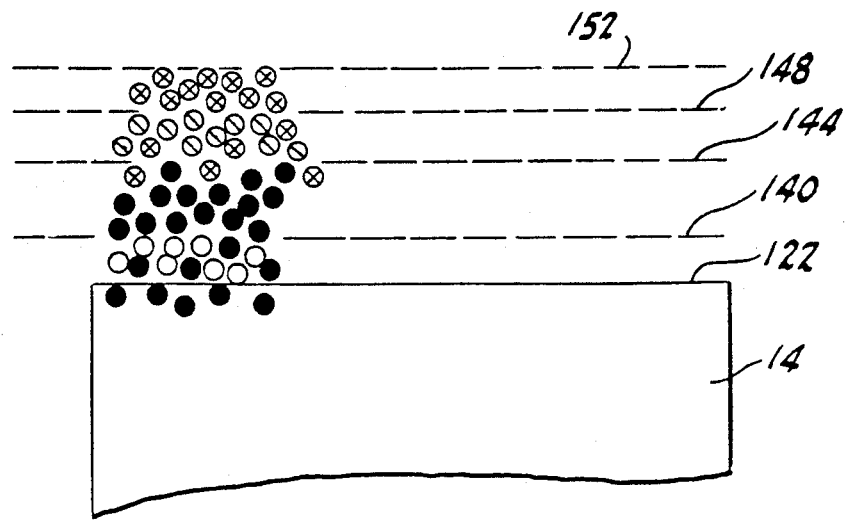
FIG. 6 is schematic view showing the layering and ion stitching resulting from a pair of ion plasma guns.
Figure 6A:
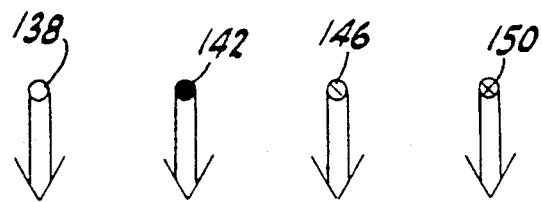
FIG. 6a represent the firing order of ions coming from the two gun plasma guns depicted in FIG. 1 and the graphical representation shown in FIG. 6.

FIGS. 6 and 6a further depict the operation of the present invention where plasma guns 22 and 24 are fired alternately. FIG. 6a represents the firing order (from left to FIGS. 6 and 6a further depict the operation of the present invention where plasma guns 22 and 24 are fired alternately. FIG. 6a represents the firing order (from left to right) of the ions in which ions 138 initially build up a layer 140 on surface 122 of the substrate 14 without the benefit of substrate 14 being biased by means 92. Ions 142 are then fired from plasma gun 22 to provide the stitching and layering described in FIG. 5b with a relatively low bias voltage 116 on substrate 14 to form layer 144. This process is repeated with plasma gun 24 such that ions 146 form another layer 148 atop layer 144. Ions 150 then stitch layer 148 to layer 144 and form an upper layer 152. It may be seen that a large variety of layering results can occur by adjusting the plasma generation voltage, or substrate bias voltage, as far as amplitude, duty cycle, and phase are concerned. Also, a plurality of plasma guns serving as MEVVA source 12 could employ different metallic cathodes to produce different metallic plasmas.

While in the foregoing embodiments of the present invention have been set forth in considerable detail for the purpose of making a complete disclosure of the invention it may be apparent to those of skill in the art that numerous changes may be made in such details without departing from the spirit and principles of the invention.

What is claimed is:

1. An apparatus for coating a surface with a metal utilizing a metal vapor vacuum arc plasma source, comprising:
   a. means for actuating the metal vapor vacuum arc plasma source in a pulsed mode at a predetermined rate, said actuating means including a pulse generator producing an output signal of a certain pulse width;
   b. means for supporting the surface to receive metal ions from the plasma source;
   c. means for electrically biasing the surface for a selected period of time during said pulsed mode operation of said means for actuating the metal vapor vacuum arc plasma source in a pulsed mode;

d. means for synchronizing the activities of said means for actuating the metal vapor vacuum arc plasma source and said means for electrically biasing the surface for a selected period of time; and e. a vacuum chamber for enclosing at least a portion of the plasma source and the surface.

2. The apparatus of claim 1 in which said means for electrically biasing the surface for a selected period of time includes means for biasing the surface in a pulsed mode at a predetermined rate, and said electrical biasing means further includes a pulse generator producing an output signal of a certain pulse width.

3. The apparatus of claim 2 in which said means for synchronizing the activities of said means for actuating the metal vapor vacuum arc plasma source and said means for electrically biasing the surface for a selected period of time includes a pulse delay unit producing signal outputs to said pulse generators of said means for actuating the metal vapor vacuum arc source and of said means for electrically biasing the surface for a selected period of time.

4. The apparatus of claim 2 in which said pulse generator of said means for electrically biasing the surface comprises a spark generator.

5. The apparatus of claim 1 in which the metal vapor vacuum arc source includes a plurality of distinct metal vapor vacuum arc plasma sources operable in said vacuum chamber, and said means for actuating the metal vapor vacuum arc source includes a pulse generator producing an output signal of a certain pulse width associated with each of the plurality of distinct metal vapor vacuum arc plasma sources.

6. The apparatus of claim 1 in which the plurality of distinct metal vapor vacuum arc plasma sources operable in said vacuum chamber includes at least two metal vapor vacuum arc plasma source, each producing a plasma of a different metal.

7. The apparatus of claim 1 which additionally comprises means for varying the intensity of said pulse width generated by said means for actuating the metal vapor vacuum arc plasma source.

8. The apparatus of claim 7 which additionally comprises means for varying the intensity of said means for electrically biasing the surface for a selected period of time.

9. A method of coating a surface with a metal utilizing a metal vapor vacuum arc plasma source comprising:

a. providing a vacuum chamber for enclosing the plasma source and the surface;

b. supporting the surface a selected distance from the plasma source in the vacuum chamber;

c. actuating the metal vapor vacuum arc plasma source in a pulsed mode and at a predetermined rate, utilizing a pulse generator producing an output signal of a certain pulse width;

d. electrically biasing the surface for a selected period for time during said pulse mode operation of said metal vapor vacuum arc plasma source; and e. synchronizing the actuation of the metal vapor vacuum arc plasma source in a pulsed mode and the electrical biasing of the surface for a selected period of time.

10. The method of claim 9 in which said synchronizing the actuation of the metal vapor vacuum arc plasma source in a pulsed mode and the electrical biasing of the surface for a selected period of time includes the step of overlapping the time period of said pulse width of the pulse generator output with the time period of said electrical biasing of the surface.

11. The method of claim 10 in which said step of synchronizing the actuation of the metal vapor vacuum arc plasma source in a pulsed mode further includes the step of determining the intensity of said output signal of a certain pulse width.

* * * * *